(12) United States Patent
Bryce et al.

(10) Patent No.: US 9,444,029 B2
(45) Date of Patent: Sep. 13, 2016

(54) PIEZOELECTRONIC TRANSISTOR WITH CO-PLANAR COMMON AND GATE ELECTRODES

(71) Applicant: International Business Machines Corporation, Armonk, NY (US)

(72) Inventors: Brian A. Bryce, Chevy Chase, MD (US); Josephine B. Chang, Mahopac, NY (US); Marcelo A. Kuroda, Auburn, AL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/747,137

(22) Filed: Jun. 23, 2015

(65) Prior Publication Data

US 2016/0126447 A1    May 5, 2016

Related U.S. Application Data

(63) Continuation of application No. 14/529,834, filed on Oct. 31, 2014, now Pat. No. 9,287,489.

(51) Int. Cl.
| | |
|---|---|
| *H01L 21/00* | (2006.01) |
| *H01L 41/08* | (2006.01) |
| *H01L 41/083* | (2006.01) |
| *H01L 41/314* | (2013.01) |
| *H01L 41/18* | (2006.01) |

(Continued)

(52) U.S. Cl.
CPC ......... *H01L 41/0805* (2013.01); *H01L 41/047* (2013.01); *H01L 41/083* (2013.01); *H01L 41/183* (2013.01); *H01L 41/1875* (2013.01); *H01L 41/1876* (2013.01); *H01L 41/314* (2013.01)

(58) Field of Classification Search
CPC ..... H01L 41/00; H01L 51/00; H01L 41/044; H01L 41/083; H01L 41/183; H01L 41/047; H01L 41/08; H01L 2224/75347; H01L 2224/79347
USPC ...................... 257/415; 438/24, 50; 310/311
See application file for complete search history.

(56) References Cited

U.S. PATENT DOCUMENTS

| | | |
|---|---|---|
| 7,848,135 B2 | 12/2010 | Elmegreen et al. |
| 8,159,854 B2 | 4/2012 | Elmegreen et al. |

(Continued)

OTHER PUBLICATIONS

List of IBM Patents or Patent Applications Treated as Related; (Appendix P), Filed Apr. 20, 2016; 2 pages.

(Continued)

*Primary Examiner* — Jarrett Stark
*Assistant Examiner* — Shahed Ahmed
(74) *Attorney, Agent, or Firm* — Cantor Colburn LLP; Vazken Alexanian

(57) ABSTRACT

A method of forming a piezoelectronic transistor (PET), the PET, and a semiconductor device including the PET are described. The method includes forming a piezoelectric (PE) element with a trench and forming a pair of electrodes on the PE element in a coplanar arrangement in a first plane, both of the pair of electrodes being on a same side of the PE element. The method also includes forming a piezoresistive (PR) element above the pair of electrodes and forming a clamp above the PR element. Applying a voltage to the pair of electrodes causes displacement of the PE element perpendicular to the first plane.

12 Claims, 6 Drawing Sheets

(51) Int. Cl.
*H01L 41/047* (2006.01)
*H01L 41/187* (2006.01)

(56) References Cited

U.S. PATENT DOCUMENTS

| | | | |
|---|---|---|---|
| 8,247,947 B2 | 8/2012 | Elmegreen et al. | |
| 8,405,279 B2 | 3/2013 | Elmegreen et al. | |
| 2011/0133603 A1* | 6/2011 | Elmegreen | H01L 49/00 310/328 |
| 2013/0009668 A1* | 1/2013 | Elmegreen | H01L 49/00 326/102 |
| 2014/0169078 A1 | 6/2014 | Elmegreen et al. | |

OTHER PUBLICATIONS

Bruce G. Elmegreen et al., "Low Voltage Transistor and Logic Devices With Multiple, Stacked Piezoelectronic Layers", U.S. Appl. No. 15/131,484, filed Apr. 18, 2016.
List of IBM Patents or Patent Applications Treated as Related; (Appendix P), Filed Jul. 9, 2015; 2 pages.
Brian A. Bryce et al., "Piezoelectronic Transistor With Co-Planar Common and Gate Electrodes", U.S. Appl. No. 14/529,834, filed Oct. 31, 2014.
Bruce G. Elmegreen et al., "Piezoelectronic Device With Novel Force Amplification", U.S. Appl. No. 14/577,279, filed Dec. 19, 2014.
Brian A. Bryce et al., "Integrating a Piezoresistive Element in a Piezoelectronic Transistor", U.S. Appl. No. 14/529,886, filed Oct. 31, 2014.
Brian A. Bryce et al., "Integrating a Piezoresistive Element in a Piezoelectronic Transistor" U.S. Appl. No. 14/747,194, filed Jun. 23, 2015.
Brian A. Bryce et al., "Passivation and Alignment of Piezoelectronic Transistor Piezoresistor", U.S. Appl. No. 14/529,929, filed Oct. 31, 2014.
Brian A. Bryce et al., "Passivation and Alignment of Piezoelectronic Transistor Piezoresistor" U.S. Appl. No. 14/747,223, filed Jun. 23, 2015.
Bruce G. Elmegreenet al., "Non-Volatile, Piezoelectronic Memory Based on Piezoresistive Strain Produced by Piezoelectric Remanence", U.S. Appl. No. 14/222,813, filed Mar. 24, 2014.
Bruce G. Elmegreen et al., "Low Voltage Transistor and Logic Devices With Multiple, Stacked Piezoelectronic Layers", U.S. Appl. No. 14/468,822, filed Aug. 26, 2014.
Matthew W. Copel et al., "Piezoelectronic Switch Device for RF Applications", U.S. Appl. No. 14/529,380, filed Oct. 31, 2014.
Matthew W. Copel et al., "Piezoelectronic Switch Device for RF Applications" U.S. Appl. No. 14/745,521, filed Jun. 22, 2015.
List of IBM Patents or Patent Applications Treated as Related; (Appendix P), Filed May 25, 2016; 2 pages.
Matthew W. Copel et al., "Piezoelectronic Switch Device for RF Applications", U.S. Appl. No. 15/163,821, filed May 25, 2016.

\* cited by examiner

PIEZOELECTRONIC TRANSISTOR WITH CO-PLANAR COMMON AND GATE ELECTRODES

DOMESTIC BENEFIT/NATIONAL STAGE INFORMATION

This application is a continuation of U.S. application Ser. No. 14/529,834 filed Oct. 31, 2014, the disclosure of which is incorporated by reference herein in its entirety.

STATEMENT OF FEDERAL SUPPORT

This invention was made with Government support under contract number N66001-11-C-4109 awarded by Defense Advanced Research Projects Agency (DARPA). The Government has certain rights in the invention.

BACKGROUND

The present invention relates to a piezoelectronic transistor, and more specifically, to a piezoelectronic transistor with co-planar common and gate electrodes.

A piezoelectronic transistor (PET) is based on a piezoelectric (PE) element modulating the resistance of a piezoresistive (PR) element. That is, applying voltage to a PE changes the shape of the PE which affects the electrical resistance of a PR element closely coupled with the PE. The PET may act as a switch or other component.

SUMMARY

According to one embodiment of the present invention, a method of forming a piezoelectronic transistor (PET) includes forming a piezoelectric (PE) element with a trench; forming a pair of electrodes on the PE element in a coplanar arrangement in a first plane, both of the pair of electrodes being on a same side of the PE element; forming a piezoresistive (PR) element above the pair of electrodes; and forming a clamp above the PR element, wherein applying a voltage to the pair of electrodes causes displacement of the PE element in a second plane perpendicular to the first plane.

According to another embodiment, a piezoelectronic transistor (PET) including a piezoelectric (PE) element with a trench formed therein; a pair of electrodes disposed on the PE element in a coplanar arrangement in a first plane, both of the pair of electrodes being on a same side of the PE element; a piezoresistive (PR) element above the pair of electrodes; and a clamp above the PR element, wherein the PE element is configured to be displaced in a second plane, perpendicular to the first plane, based on a voltage being applied to the pair of electrodes.

According to yet another embodiment, a semiconductor device includes a piezoelectronic transistor (PET) including a piezoelectric (PE) element with a trench formed therein, a pair of electrodes disposed on the PE element in a coplanar arrangement in a first plane, both of the pair of electrodes being on a same side of the PE element, and a piezoresistive (PR) element above the pair of electrodes; and a voltage source configured to apply a voltage to the pair of electrodes, the voltage resulting in an electric field in the PE element, wherein the PE element is configured to be displaced in a second plane, perpendicular to the first plane, based on the electric field in the PE element.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, a PET generally is based on modulating resistance of a PR element with a PE element. That is, the PR element is programmable based on displacement of the PE element. The PET may be used as a switch device, for example, based on modulating the PR element from a low to a high resistive state or visa versa. Typically, an electric field is applied to the PE element along the same direction as the resulting displacement of the PE element. That is, a PE element is typically held between two electrodes in a vertical arrangement, and a field applied between the two electrodes (a vertical field through the PE element) results in vertical displacement of the PE element. In this case, the length of the PE element affects the switching time of the PET. Specifically, a shorter PE element results in a shorter switching time. However, the fabrication of the PE element in thin films is more difficult than the use of bulk material. Embodiments of the systems and methods described herein relate to a PET that includes a co-planar arrangement of electrodes on the PE element. The application of a voltage difference between the co-planar electrodes on the PE element results in a multi-directional field inside the PE element. That is, the PET involves a multi-directional field resulting in vertical displacement of the PE element according to an exemplary arrangement. The portion of the PE element that participates in the displacement may be selected based on the specific arrangement and fabrication, as detailed below. As a result, fabrication of the PET is simplified by facilitating the use of bulk material for the PE element.

Figure 1:
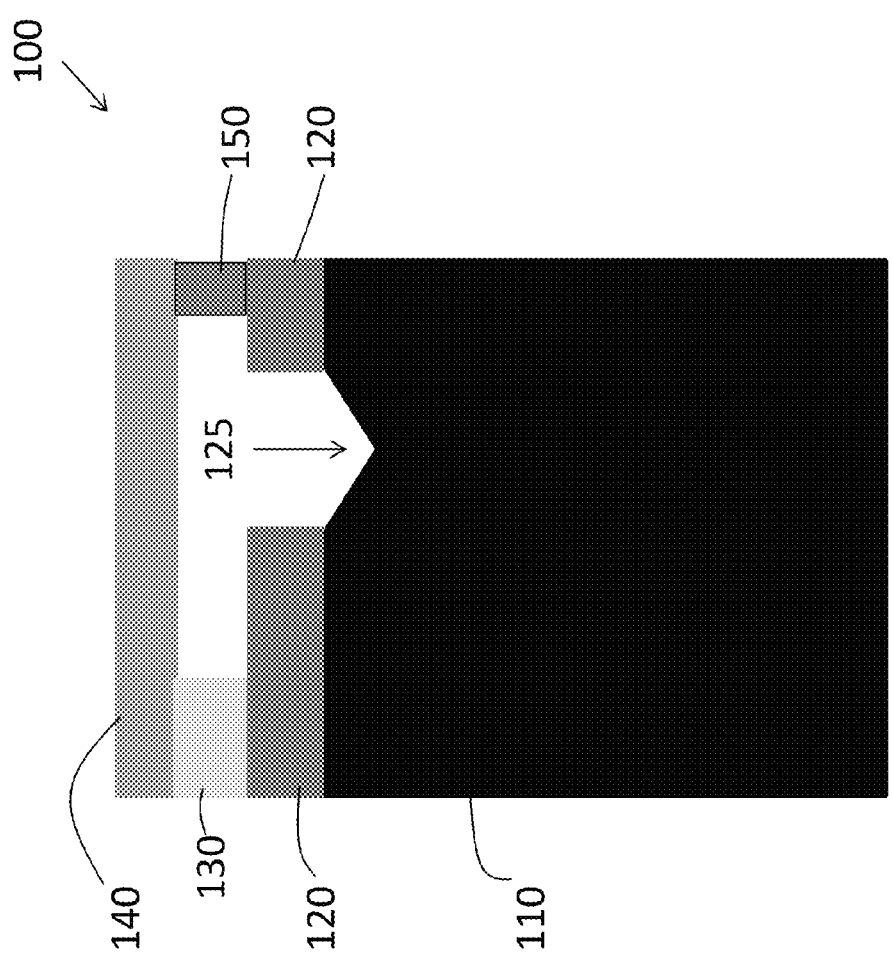
FIG. 1 depicts aspects of an exemplary PET according to an embodiment of the invention.

FIG. 1 depicts aspects of an exemplary PET 100 according to an embodiment of the invention. The PET 100 includes a PE element 110, two electrodes 120, a PR element 130, and a clamp 140 or other component defining a boundary for the PET 100. The PE element 110 may be a bulk material comprising, for example, lead zirconate titanate (PZT). According to another embodiment, the PE element 110 may be comprised of lead magnesium niobate-lead titanate (PMN-PT). While the PE element 110 may instead be comprised of thin films, bulk material may be fabricated more easily. Further, unlike current piezoelectronic transistors, thin films are not required to scale the PE element 110. Instead, the trench 125 shown in the PE element 110 is used for scaling (the patterned electrodes 120 on the PE 110 are dimensioned as needed). The depth and width (which correlates with a distance between the electrodes 120) of the divot or trench 125 and the angle of the trench 125 determines the amount of the PE element 110 that participates in the PET 100. That is, the wider and deeper the trench 125, the more of the PE element 110 participates and is displaced based on an electric field applied across the electrodes 120. The more of the PE element 110 that participates, the slower the PET 100 switching speed.

Figures 2, 3:
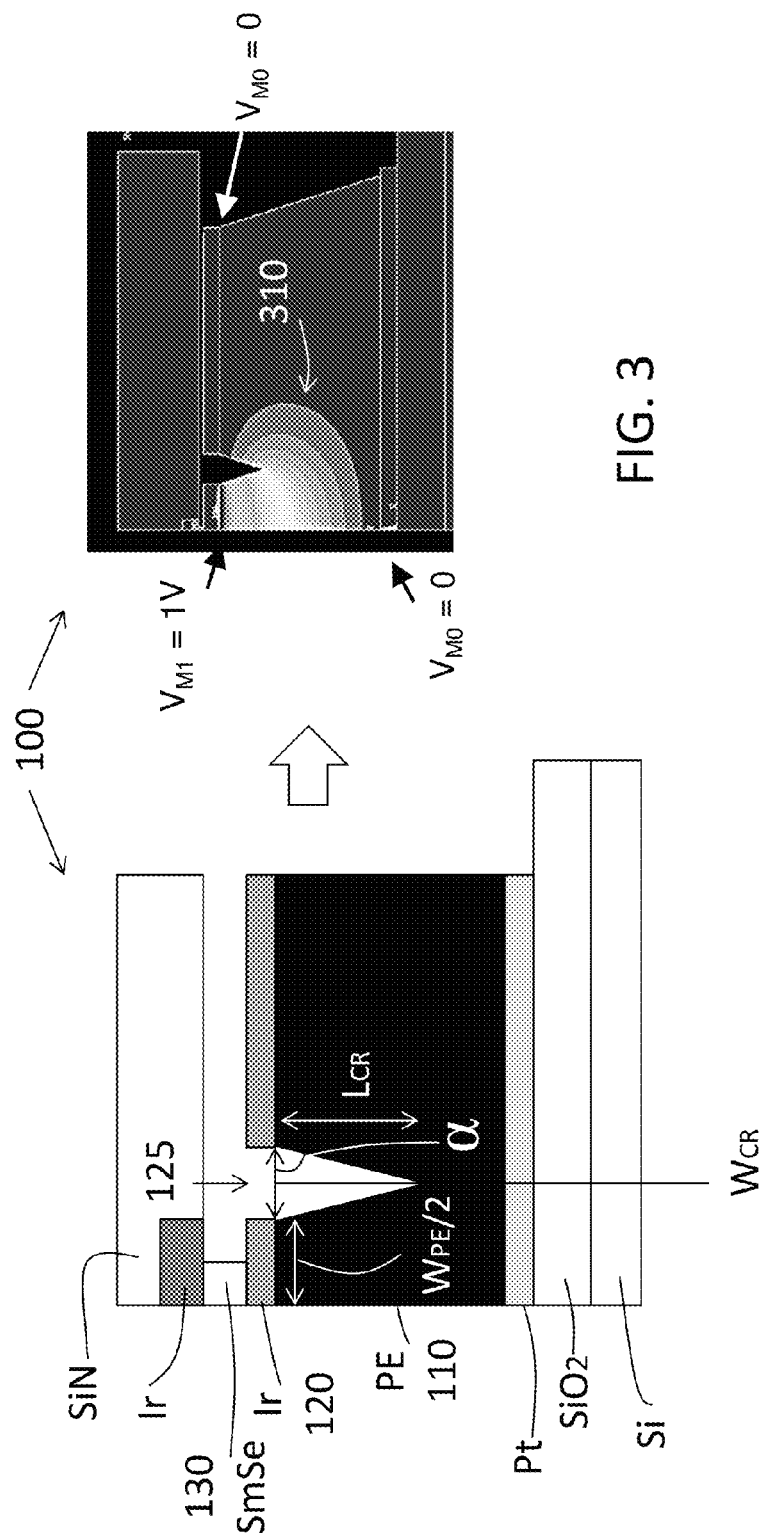
FIG. 2 indicates variable dimensions of an exemplary PET.
FIG. 3 illustrates electrical boundary conditions of an exemplary PET.

As shown in FIG. 1, the metal electrodes 120 are coplanar above the PE element 110 (as opposed to one above and one below the PE element 110). When a voltage is applied between the electrodes 120 a multi-directional field is induced in the PE between the electrodes. This field has both horizontal and vertical components as shown in FIG. 3, for example. Most of the field energy is contained inside the PE element due to its large dielectric constant relative to air. This focusing effect bends the field lines around the trench 125. Both the horizontal and vertical field components contribute to the vertical displacement of the PE element 110. The displacement of the PE element 110 causes a change in the electrical resistance of the PR element 130. The effect on the PR element 130 is based on the clamp 140, which maintains the overall volume of the PET 100. The clamp 140 is held in place based on the anchor 150 (e.g., a dielectric). The clamp 140 is anchored to the anchor 150 in part due to the air gap (low-modulus gap) between the PR element 130 and anchor 150. Because the clamp 150 is not displaced, displacement of the PE element 110 results in the PR element 130 being squeezed (or expanded again). This pressure cycle results in the switching of the PR element 130 from a low to high (and visa versa) resistive state.

FIG. 2 indicates variable dimensions of an exemplary PET 100. The exemplary PET 100 stack in micro meters (μm) is given by: silicon (Si)/silicon dioxide (SiO$_2$) (0.1)/platinum (Pt) (0.1)/PE 110 (e.g., PZT) (1)/electrodes 120 (e.g., iridium (Ir)) (0.1)/PR element 130 (e.g., samarium selenium (SmSe)) (0.03)/Ir (0.1)/silicon nitride (SiN) (0.2). These dimensions are only exemplary and are not intended to limit PET 100 devices according to embodiments of the invention. As indicated by the example, the thickness of the PE element 110 layer may be 1 μm. That is, a bulk material may be used rather than thin film layers, which may simplify fabrication. The bulk material may be used to achieve the same performance as thin films by engaging a smaller portion of the PE element 110. The variable dimensions that affect the operation of the PET 100 device include the width of the participating portion of the PE element 110 (half of which is indicated as W$_{PE}$/2), the depth of the trench 125 (L$_{CR}$), and the width of the trench 125 or the distance between the electrodes 120 (W$_{CR}$). The angle of the trench a also affects performance by affecting the stress in the PR element 130. The exemplary a shown in FIG. 2 is 80 degrees. As the angle α increases, the trench 125 becomes deeper, more of the PE element 110 participates and, thus, more stress is put on the PR element 130.

FIG. 3 illustrates electrical boundary conditions of an exemplary PET 100. As noted above, a voltage applied to the (horizontally arranged) co-planar electrodes 120 results in the multi-directional field in the PE element 110 illustrated in FIG. 3. The electrical boundary conditions 310 result from the dimensions of the exemplary trench 125 shown in FIG. 2. The electrical boundary conditions 310 indicate the result of applying a voltage to the electrodes 120 across the PE element 110. The electric field formed around the trench 125 is illustrated in FIG. 3. The size of the electrical boundary condition corresponds with the dimensions of the trench 125 such that the deeper and wider the trench 125, the larger the electrical boundary conditions, and the more of the PE element 110 is participating. As noted above, the more of the PE element 110 that participates, the slower the PET 100 device, generally. The deeper the trench 125 and the more of the PE element 110 that participates, the lower the voltage that needs to be applied to the electrodes 120 to generate the same pressure on the PR element 130.

Figures 4, 5:
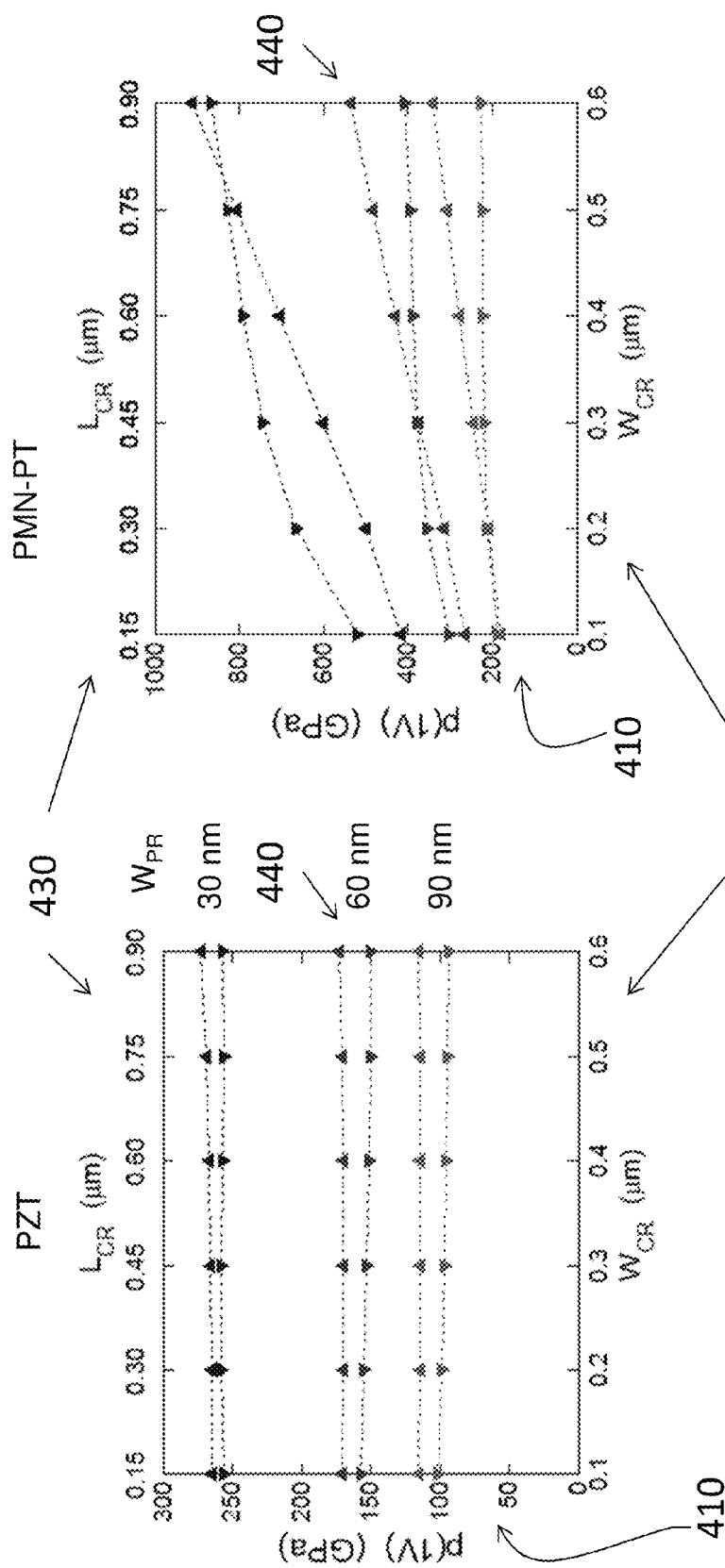
FIG. 4 indicates the dependency of the PR element pressure on trench dimensions for a PE element comprised of PZT.
FIG. 5 indicates the dependency of the PR element pressure on trench dimensions for a PE element comprised of PMN-PT.

FIG. 4 indicates the dependency of the PR element 130 pressure on trench 125 dimensions for a PE element 110 comprised of PZT. FIG. 5 indicates the dependency of the PR element 130 pressure on trench 125 dimensions for a PE element 110 comprised of PMN-PT. In both FIGS. 4 and 5, pressure resulting in the PR element 130 based on 1 volt of voltage applied to the electrodes 120 (FIGS. 1 and 2) is shown on the axis 410. The width of the trench 125 (W$_{CR}$) is indicated on the axis 420, the depth or length of the trench 125 (L$_{CR}$) is indicated on the axis 430, and the width of the PR element 130 (W$_{PR}$) is indicated on the axis 440. As FIG. 4 indicates, when the PE element 110 is PZT, the trench 125 width and depth as well as W$_{PE}$ (which may be on the order of 300 to 800 nano meters, for example) have less significant effect than the width of the PR element 130 (W$_{PR}$). FIG. 4 indicates that an increase in the width of the PR element 130 (e.g., a comparison of W$_{PR}$ of 30 nm to 90 nm) reduces performance (decreased pressure on the PR element 130). As indicated by FIG. 5, when the PE element 110 is comprised of PMN-PT, dependence on the trench 125 width and depth may be relatively more significant. Pressure created in the PR element 130 when the PE element 110 is comprised of PMN-PT may be double or triple the pressure created in the PR element 130 when the PE 1 element 10 is comprised of PZT. These effects are further detailed below.

Figure 6:
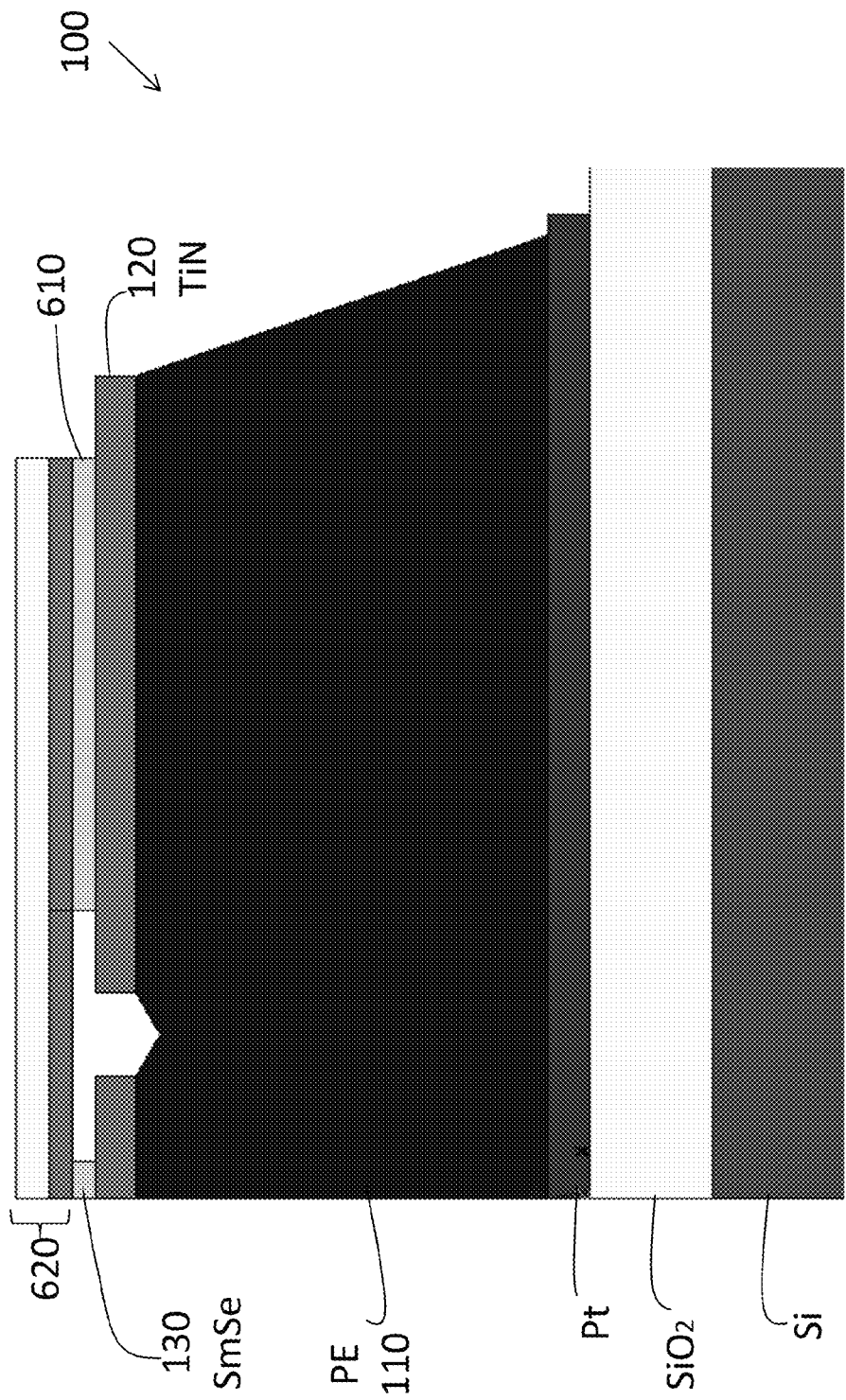
FIG. 6 illustrates an exemplary self-clamped PET according to an embodiment of the invention.

FIG. 6 illustrates an exemplary PET 100 according to an embodiment of the invention. For the PET 100 shown in FIG. 6, the angle of the trench a is 70 degrees. The exemplary PET 100 stack in micro meters (μm) is given by: silicon (Si)/SiO$_2$ (0.1)/Pt (01)/PE 110 (e.g., PZT) (1)/electrodes 120 (e.g., titanium nitride (TiN)) (0.1)/PR element 130 (e.g., SmSe) (0.03)/clamp 620 of TiN (0.05) and SiO$_2$ (0.2). A side gate 610 (dielectric that adheres the clamp 620 to the gate) is used to anchor the clamp 620 rather than using a separate anchor (e.g., 150, FIG. 1). This arrangement saves layout area that would otherwise be used for a dielectric (e.g., anchor 150).

Figure 7:
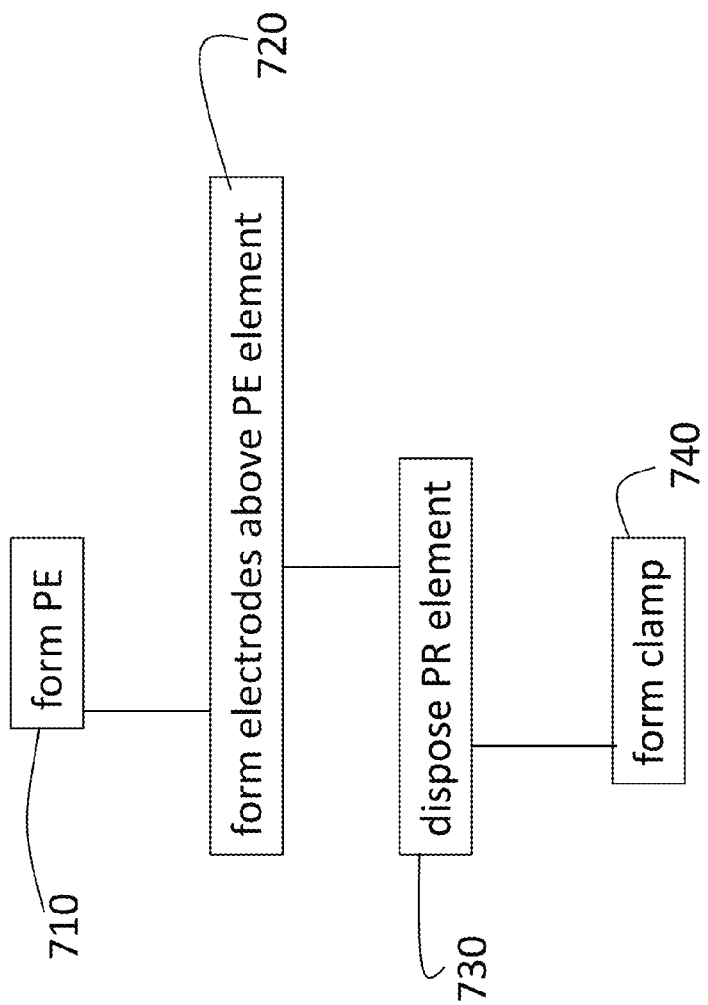
FIG. 7 is a process flow of a method of forming aspects of a PET device according to embodiments of the invention.

FIG. 7 is a process flow of a method of forming aspects of a PET 100 device according to embodiments of the invention. The aspects that are of interest here include the arrangement of the PE element 110, PR element 130 and clamp 150, 620. At block 710, forming the PE element 110 includes using either a bulk material or thin films. The material may be PZT or PMN-PT, for example. Forming electrodes 120 above the PE element 110, at block 720, includes arranging the electrodes 120 in the same plane above the PE element 110 such that application of a voltage to the electrodes 120 results in a multi-directional field in the PE element 110. This field between the electrodes 120 causes vertical displacement of the PE element 110. The process of patterning the electrodes 120 includes forming a trench 125 in the PE element 110. At block 730, disposing the PR element 130 above an electrode 120 and forming a clamp 150, 620, at block 740, above the PR element 130 facilitates pressure cycling the PR element 130 based on modulation of the PE element 110. The pressure cycling switches the PR element 130 from a low to high (and visa versa) resistive state.

Figure 8:
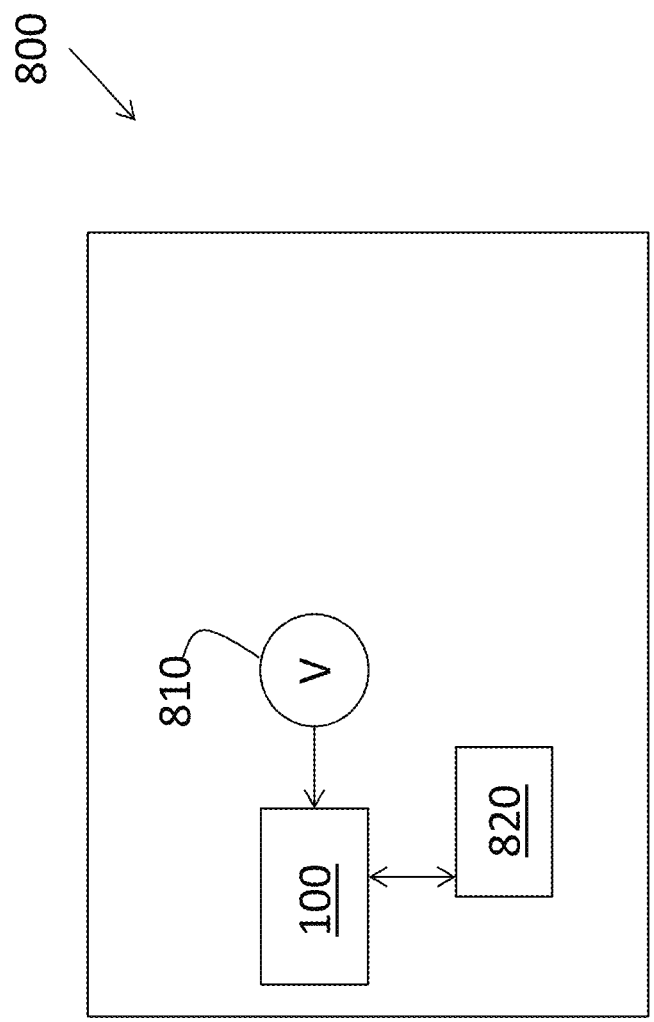
FIG. 8 is a block diagram of aspects of a semiconductor device including a PET device.

FIG. 8 is a block diagram of aspects of a semiconductor device 800 including a PET 100 device. A voltage source 810 is used to apply a voltage across the electrodes 120 to modulate the PE element 110. As discussed above, this modulation results in switching the PR element 130 between a low and high resistive state. When the PET 100 device is used as a memory element, read and write components 820 may be coupled to the PET 100 device. The PET 100 device may be used as a switch in another context as part of semiconductor device 800, as well. The metrics used to evaluate the PET 100 include the pressure transferred to the PR element 130, the displacement of the PE element 110, and the voltage that must be applied to operate the PET 100. As noted above, when the PE element 110 is comprised of PZT, the width of the PR element 130 has more effect on the pressure than the dimensions of the PE element 110 or trench 125. That is, an increase in the width of the PR element 130 ($W_{PR}$) results in reduced pressure on the PR element 130 (reduced performance). When the PE element 110 is comprised of PMN-PT, the effect of the trench 125 dimensions is higher and, generally, pressure on the PR element 130 is double or triple the pressure on the PR element 130 when the PE element 110 is comprised of PZT. The displacement of the PE element 110 is affected by the trench 125 dimensions because more of the PE element 110 participates (more displacement occurs) when the angle of the trench 125 a is higher, when the trench 125 is wider or deeper. The voltage that must be applied to the electrodes 120 to modulate the PE element 110 decreases as the trench 125 depth increases. This is because more of the PE element 110 participates. The voltage needed also decreases as the claim 620 thickness increases, because the increased clamp 620 thickness results in more pressure being applied to the PR element 130 for the same voltage.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A piezoelectronic transistor (PET), comprising:
   a piezoelectric (PE) element with a trench formed therein;
   a pair of electrodes disposed on the PE element in a coplanar arrangement in a first plane, both of the pair of electrodes being on a same side of the PE element;
   a piezoresistive (PR) element above the pair of electrodes; and
   a clamp above the PR element, wherein the PE element is configured to be displaced perpendicular to the first plane, based on a voltage applied to the pair of electrodes.

2. The PET according to claim 1, wherein a width of the trench is defined by a distance between the pair of electrodes.

3. The PET according to claim 1, wherein the PE element is comprised of lead magnesium niobate-lead titanate (PMN-PT) and an increase in a depth of the trench increases a displacement of the PE element and a resulting pressure on the PR element when the voltage is applied to the pair of electrodes and an electric field is generated in the PE element.

4. The PET according to claim 1, wherein the PE element is comprised of lead zirconate titanate (PZT) and a decrease in the thickness of the PR element increases a pressure on the PR element when the voltage is applied to the pair of electrodes.

5. The PET according to claim 1, wherein an increase in an angle of the trench increases a displacement of the PE element and a resulting pressure on the PR element when the voltage is applied to the pair of electrodes and an electric field is generated in the PE element.

6. The PET according to claim 1, further comprising a dielectric anchor to secure the clamp and prevent movement of the clamp based on a displacement of the PE element.

7. The PET according to claim 1, wherein the claim is a stand-alone configured to be anchored by a side gate of the PET.

8. A semiconductor device, comprising:
   a piezoelectronic transistor (PET) comprising
      a piezoelectric (PE) element with a trench formed therein,
      a pair of electrodes disposed on the PE element in a coplanar arrangement in a first plane, both of the pair of electrodes being on a same side of the PE element, and
      a piezoresistive (PR) element above the pair of electrodes; and a voltage source configured to apply a voltage to the pair of electrodes, the voltage resulting in an electric field in the PE element, wherein the PE element is configured to be displaced in a second plane, perpendicular to the first plane, based on the electric field in the PE element.

9. The device according to claim 8, further comprising a clamp of the PET above the PR element.

10. The device according to claim 8, wherein the PE element is comprised of lead magnesium niobate-lead titanate (PMN-PT) and an increase in a depth of the trench increases a displacement of the PE element and a resulting pressure on the PR element when the voltage is applied to the pair of electrodes and the electric field is generated in the PE element.

11. The device according to claim 8, wherein the PE element is comprised of lead zirconate titanate (PZT) and an decrease in a width of the PR element increases a pressure on the PR element when the voltage is applied to the pair of electrodes.

12. The device according to claim 8, wherein an increase in an angle of the trench increases a displacement of the PE element and a resulting pressure on the PR element when the voltage is applied to the pair of electrodes and the electric field is generated in the PE element.

* * * * *